United States Patent [19]

Hammerschmidt et al.

[11] Patent Number: 5,486,447

[45] Date of Patent: * Jan. 23, 1996

[54] NEGATIVE RESISTS WITH HIGH THERMAL STABILITY COMPRISING END CAPPED POLYBENZOXAZOLE AND BISAZIDE

[75] Inventors: Albert Hammerschmidt, Erlangen; Eberhard Kühn, Hemhofen; Erwin Schmidt, Erlangen, all of Germany

[73] Assignee: Siemens Aktiengesellschaft, Munich, Germany

[*] Notice: The portion of the term of this patent subsequent to Dec. 27, 2011, has been disclaimed.

[21] Appl. No.: 330,227

[22] Filed: Oct. 27, 1994

Related U.S. Application Data

[63] Continuation of Ser. No. 672,940, Mar. 21, 1991, abandoned.

[30] Foreign Application Priority Data

Mar. 29, 1990 [DE] Germany .................. 40 10 125.8

[51] Int. Cl.$^6$ .................. G03F 7/012; G03F 7/40
[52] U.S. Cl. .................. 430/197; 430/167; 430/194; 430/196; 430/325; 430/330; 430/906
[58] Field of Search .................. 430/197, 195, 430/167, 194, 196, 906, 330, 325

[56] References Cited

U.S. PATENT DOCUMENTS

| | | | |
|---|---|---|---|
| 2,852,379 | 9/1958 | Hepher et al. | 96/91 |
| 2,940,853 | 6/1960 | Sagura et al. | 96/91 |
| 4,339,521 | 7/1982 | Ahne et al. | 430/190 |
| 4,551,409 | 11/1985 | Gulla et al. | 430/197 |
| 4,565,767 | 1/1986 | Kataoka et al. | 430/197 |
| 4,845,183 | 7/1989 | Mueller et al. | 528/185 |
| 4,927,736 | 5/1990 | Mueller et al. | 430/197 |
| 5,021,320 | 6/1991 | Mueller et al. | 430/192 |
| 5,114,826 | 5/1992 | Kwong et al. | 430/192 |
| 5,238,776 | 8/1993 | Zampini | 430/192 |

FOREIGN PATENT DOCUMENTS

| | | |
|---|---|---|
| 0023662 | 5/1983 | European Pat. Off. . |
| 0041677 | 12/1984 | European Pat. Off. . |
| 0291779 | 11/1988 | European Pat. Off. . |
| 2948324 | 8/1985 | Germany . |
| 3716629 | 12/1988 | Germany . |
| 2216532 | 11/1989 | United Kingdom . |

OTHER PUBLICATIONS

IEEE Transactions on Electron Devices, vol. Ed–28 No. 11, Nov. 1981: *Azide–Phenolic Resin Photoresists for Deep UV Lithography*, Iwayanagi et al., pp. 1306–1310.

*Primary Examiner*—John S. Chu
*Attorney, Agent, or Firm*—Kenyon & Kenyon

[57] ABSTRACT

Cost-effective, negative resists having high thermal stability based on oligomeric and/or polymeric polybenzoxazole precursors are disclosed. Also disclosed are resist solutions having a high level of storage stability when they contain a photoactive component in the form of a bisazide and when the polybenzoxazole precursors are hydroxypolyamides having the following structure:

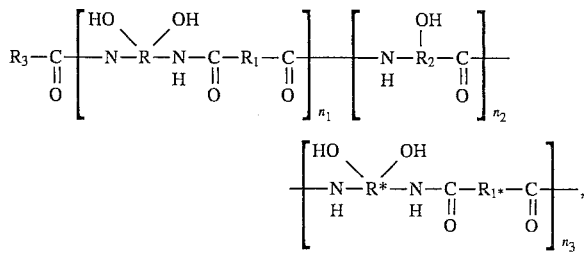

where R, R*, $R_1$, $R_1$* and $R_2$ are aromatic groups, $R_3$ is an aromatic group or a norbornene residue, and wherein $n_1$, $n_2$ and $n_3$, are defined as follows:

$n_1$=1 to 100, $n_2$ and $n_3$=0 or $n_1$ and $n_2$=1 to 100, $n_3$=0 or $n_2$=1 to 100, $n_1$ and $n_3$=0 or $n_1$, $n_2$ and $n_3$=1 to 100 (with R≠R* or $R_1$≠$R_1$* or both) or $n_1$ and $n_3$=1 to 100, $n_2$=0 (with R≠R* or $R_1$≠$R_1$* or both), on the condition that: $n_1+n_2+n_3 \geq 3$.

6 Claims, No Drawings

NEGATIVE RESISTS WITH HIGH THERMAL STABILITY COMPRISING END CAPPED POLYBENZOXAZOLE AND BISAZIDE

This application is a continuation, of application Ser. No. 07/672,940 filed Mar. 21, 1991 now abandoned.

BACKGROUND OF THE INVENTION

The present invention relates to negative resists having high thermal stability based on oligomeric and/or polymeric polybenzoxazole precursors, as well as to a method for manufacturing highly heat-resistant relief structures from these negative resists.

Hydroxypolyamides are used as soluble polybenzoxazole precursors in high-temperature-resistant photoresists. Such photoresists are needed to directly structure organic insulating layers in a cost-effective manner. The polybenzoxazoles obtained from the hydroxpolyamides are distinguished by high temperature resistance, low water absorption, and excellent electrical properties. The polybenzoxazoles can be used as etching masks, particularly in alkaline etching processes, but they can also be used as organic dielectric materials in semiconductor manufacturing.

Photostructurable polybenzoxazole precursors can find applications in both positive and negative resists. The positive resists contain a photoactive component in the form of a diazoquinone in addition to the polymer precursor (c.f., European Patent 0 023 662, European Published Patent Application 0 291 779 and German Published Patent Application 37 16 629). The negative resists have polymer precursors with cross-linkable, unsaturated groups (c.f., European Patent 0 041 677).

However, storage stability problems can occur for both positive and negative resists. In the case of concentrated positive resist solutions containing hydroxypolyamides, a polycondensation reaction can occur. Negative resists tend to polymerize due to the presence of unsaturated groups, such as acrylic and metacrylic groups. In both resist types, this leads to an increase in viscosity or even to the formation of a gel. Moreover, in the case of positive resists, the photoactive component can be destroyed by terminal alkaline amino groups or by amine monomers and amide oligomers.

SUMMARY OF THE INVENTION

The present invention provides cost-effective, high-thermal-stability negative resists based on oligomeric and/or polymeric polybenzoxazole precursors and overcomes the storage stability difficulties previously encountered with these types of resists.

These and other objectives are achieved by the present invention in that the resists contain a photoactive component in the form of a bisazide and in that the polybenzoxazole precursors are hydroxypolyamides having the following structure:

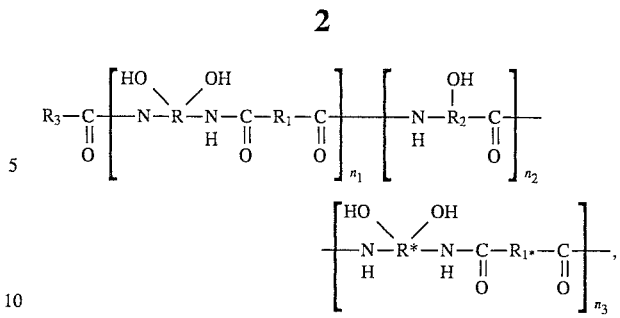

wherein R, R*, $R_1$, $R_1$* and $R_2$ are aromatic groups, $R_3$ is an aromatic group or a norbornene residue, and with respect to $n_1$, $n_2$ and $n_3$, the following applies:

$n_1$=1 to 100, $n_2$ and $n_3$=0 or $n_1$ and $n_2$=1 to 100, $n_3$=0 or $n_2$=1 to 100, $n_1$ and $n_3$0 or $n_1$, $n_2$ and $n_3$=1 to 100 (with R≠R* or $R_1$≠$R_1$* or both) or $n_1$ and $n_3$=1 to 100, $n_2$=0 (with R≠R* or $R_1$≠$R_1$* or both), on the condition that: $n_1$+$n_2$+$n_3$≧3.

From the hydroxypolyamides of the type mentioned above, relief structures can be unexpectedly produced in the presence of a bisazide using photolithographic means, which relief structures exhibit a high dimensional stability under heat both during and after tempering.

The polybenzoxazole precursors themselves exhibit excellent storage stability in solution, both with respect to the viscosity of the solution and with respect to the stability of the photoactive component. Moreover, the photoresists of the present invention have a very low dark field loss during development. A resulting 35% loss in layer thickness during tempering corresponds to that of the pure polybenzoxazole precursors and represents the optimal value attainable for this system.

Contrary to the known negative resists based on polybenzoxazoles, the resists of the present invention do not contain any hydroxypolyamides with unsaturated groups. Instead, these resists contain a photoactive component in the form of a bisazide. While the application of bisazide-group-containing photoactive components in negative resists is already known, they have previously been used only with natural and synthetic rubbers (c.f., U.S. Pat. No. 2,852,379 and U.S. Pat. No. 2,940,853). The application of sulfone-group-containing bisazides is also known for rubbers as well as for other polymers, such as polystyrene, polyamide, novolak resins, poly (vinylphenol) and poly (vinylbutyral) (c.f., German Patent No. 29 48 324 and *IEEE Trans. Electron Devices*, Vol. ED-28 (1981), pp. 1306–1310).

In contrast, the resists of the present invention use polybenzoxazole precursors in the form of specific hydroxypolyamides. In these hydroxypolyamides, the normally present amino terminal groups are modified in quite specific manner. Generally, R and R* are defined as follows for the hydroxypolyamides of the present invention:

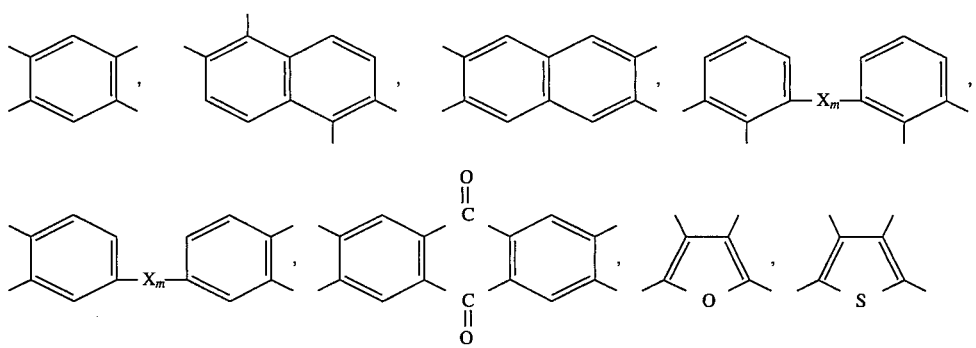

and

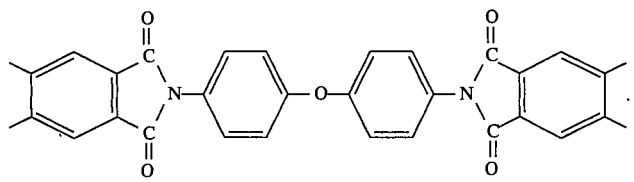

$R_1$ and $R_1{}^*$ are defined as follows, wherein H-atoms can also be substituted by Cl or Br:

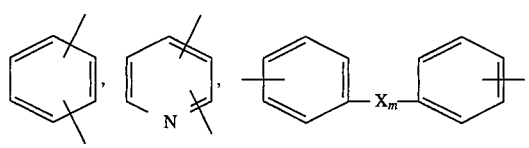

and

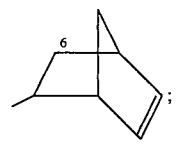

$R_2$ can be defined as follows:

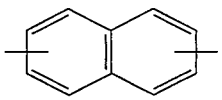

and

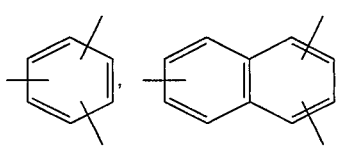

wherein the aromatic residues can have alkyl substituents. $R_3$ can be defined as follows:

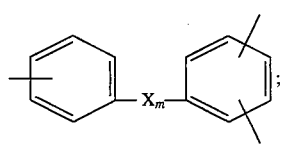

-continued
and

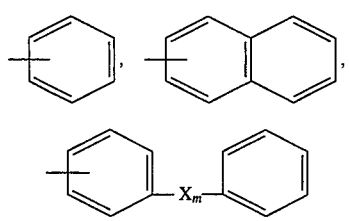

wherein the aromatic residues can also have halogen substituents or alkyl substituents. Furthermore, a COOH group can be arranged on the aromatic residues in the o-position to the bond to the acid amide grouping (—CO—NH—). A corresponding group can be arranged in the 6-position of the norbornene residue.

Finally, n=0 or 1, and X is defined as follows:

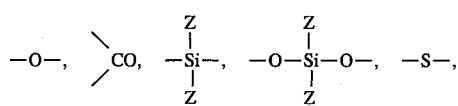

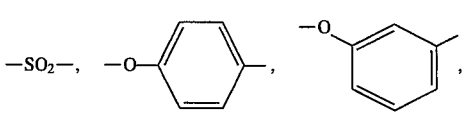

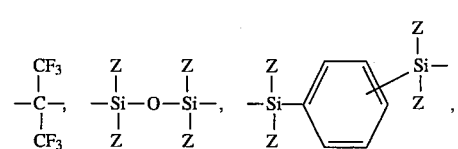

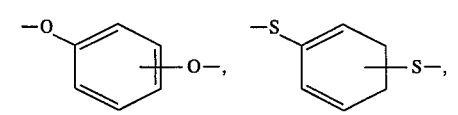

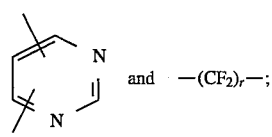 and —(CF$_2$)$_r$—;

wherein Z=alkyl with 1 to 10 carbon atoms or aryl, and r=2 to 18.

Serving as base materials for the hydroxypolyamides are polycondensation products, specifically:

co-polycondensation products of aromatic diaminodihydroxy compounds and aromatic dicarboxylic acids or dicarboxylic acid chlorides;

homo-polycondensation products of aromatic aminohydroxy carboxylic acids;

co-polycondensation products of aromatic diaminodihydroxy compounds, aromatic dicarboxylic acids or dicarboxylic acid chlorides and aromatic aminohydroxy carboxylic acids.

Preferred hydroxypolyamides are as follows: Polycondensation products of 3,3'-dihydroxybenzidine and isophthalic acid dichloride;

Polycondensation products of 3,3'-dihydroxybenzidine, 2,2-bis(3-amino-4-hydroxyphenyl)-1,1,1,3,3,3-hexafluoropropane and isophthalic acid dichloride;

polycondensation products of 3-amino-4-hydroxy benzoic acid.

Besides 3,3'-dihydroxybenzidine (i.e., 3,3'-dihydroxy-4,4'-diaminobiphenyl), isomers of this compound can also be applied as the diaminodihydroxy compounds. Other hydroxyl-group-containing aromatic diamines, such as 3,3'-dihydroxy-4,4'-diaminodiphenyl ether, can also be used. In addition to isophthalic acid dichloride, isophthalic acid can be used as a dicarboxylic acid. Terephthalic acid can also serve as a dicarboxylic acid, while terephthalic acid dichloride can serve as a dicarboxylic acid derivative.

The base materials contain amino terminal groups, which become modified. More specifically, the amino groups are converted to acid amide groups (of aromatic carboxylic acids or norbornene carboxylic acid). The modification takes place in such a way that the amino terminal groups are reacted with suitable carboxylic acid derivatives and, in particular, with carboxylic acid chlorides or dicarboxylic acid anhydrides.

Aromatic bisazides, preferably 2,6-bis(4'-azidobenzal)-cyclohexanone or 2,6-bis(4'-azidobenzal)- 4-methylcyclohexanone, especially find application as a photoactive component in the negative resists of the present invention. Other compounds can also be applied, such as 4,4'-diazidobenzophenone and 4,4'-diazidodiphenylmethane. The mass ratio of hydroxypolyamide to bisazide, advantageously is from 1:20 to 20:1, preferably from 1:10 to 10:1.

To manufacture highly heat-resistant relief structures according to the present invention, a negative resist in the form of a layer or foil is applied to a substrate and exposed to actinic light through an overlay mask, or it is irradiated by directing a beam of light, electrons or ions. The unexposed or non-irradiated portions of the layer or foil parts are subsequently dissolved or otherwise removed and the resulting relief structures tempered.

The photoresist of the present invention is advantageously applied to the substrate dissolved in an organic solvent. Preferably, one uses N-methylpyrrolidone as a solvent. However, other organic solvents with similar properties can find application, such as dimethylformamide, N,N-dimethylacetamide, and mixtures of the above-mentioned solvents.

An adhesive agent and/or a wetting agent can be used in the manufacture of the relief structures. Adhesive agents or wetting agents can be added to the polymer solution, but they can also be applied to the substrate before the coating process. The polymer solution is preferably applied to the substrate by means of a centrifugal technique, by means of dipping or spraying processes, or by other coating methods, such as brushing and rolling. The substrate consists preferably of glass, metal (in particular, aluminum), plastic or a semiconducting material.

The conversion of the structured polymer layers into polybenzoxazoles having high thermal stability is accomplished by means of a tempering process. Generally, temperatures of between 200° and 500° C. are selected. Preferably, the tempering process takes place at a temperature of between 300° and 450° C.

The invention shall be clarified in greater detail based on the following preferred embodiments.

DETAILED DESCRIPTION

1. Preparing a Hydroxypolyamide 105 parts by weight of 2,2-bis(3-amino-4-hydroxyphenyl)-1,1,1,3,3,3-hexafluoropropane and 62 parts by weight of 3,3'-dihydroxybenzidine are dissolved under an argon atmosphere in 1380 parts by weight of N,N-dimethylacetamide and 250 parts by weight pyridine. 104 parts by weight of isophthalic acid dichloride, dissolved in 460 parts by weight of cyclohexanone, are then added dropwise, with vigorous stirring, to the above solution, after cooling to 0° C. After 2½ hours of stirring, the reaction mixture is warmed to room temperature and stirred for another 3½ h. After standing for 12 hours, 32.2 parts by weight of benzoylchoride are slowly added to the reaction mixture in a dropwise manner while stirring, and the mixture allowed to stand for 12 h at room temperature. The reaction solution is subsequently added dropwise into 18 liters of water. The polymer that separates out is then washed and dried in a vacuum-drying oven over NaOH.

2. Purifying the Hydroxypolyamide

The hydroxypolyamide prepared according to Example 1 is purified by means of ion exchange materials. For this purpose, 150 parts by weight of a commercial anionic exchange material are suspended in distilled water, packed into a chromatographic column and washed until neutral; the water is subsequently replaced by N-methylpyrrolidone. Similarly, 100 parts by weight of a commercial cationic exchange material are suspended in distilled water, packed into a chromatographic column, and washed with 10% HCl until the eluate is acidic. The material is subsequently washed with water until it becomes neutral and chloride free. The water is subsequently replaced by N-methylpyrrolidone.

To carry out the purification process, 200 parts by weight of dried hydroxypolyamide are dissolved in 2000 parts by weight of N-methylpyrrolidone. The solution is then added to the anionic and the cationic exchange materials. The polymer solution purified in this manner is added dropwise to approximately 17 liters water to precipitate the polymer. The polymer is then isolated, washed, and dried in a vacuum-drying oven over NaOH.

Solutions of polybenzoxazole precursors in the form of terminal-group-modified hydroxypolyamides prepared in this manner are distinguished from solutions of corresponding, non-terminal-group-modified hydroxypolyamides by their particularly high viscosity stability. Specifically, 33% solutions of the first-mentioned type are stable at a storage temperature of 40° C. for nearly 150 th, while solutions of the second type experience an increase in viscosity after only about 15 th.

3. Preparing a Resist Solution 15 parts by weight of a polybenzoxazole precursor prepared and purified in the above-described manner are added to a solution containing 3 parts by weight of 2,6-bis(4'-azidobenzal)-4-methylcyclohexanone in 51 parts by weight of N-methylpyrrolidone. The resulting solution is then pressure-filtered through a 0.8 μm filter.

This type of solution is storage stable with respect to both the viscosity and the technological properties of the solution. Thus at a storage temperature of 40° C., there is no increase in viscosity within 160 th, and at a storage temperature of −18° C., the technological properties are still unchanged after 20 days.

4. Manufacturing a Relief Structure

An adhesive agent is first applied to a silicon disk (5000 revolutions/min-30 s; 80° C.-10 min.). The silicon disk is then coated with a photoreactive solution prepared according to Example 3 (layer thickness, 2.7 μm) by means of a centrifugal process (1200 revolutions/min-20 s). The coated disk is subsequently exposed to light through an overlay mask for 30 s (MJP 55: 42 mW/cm², measured with OAI 400 nm), developed with an MIF-developer NMD-3 (0.32%) and then tempered in a diffusion oven under nitrogen (tempering program: room temperature to 170° C.: 1 h; 170° to 300° C.: 1 h; 300° to 400° C.: 1 h; 400° C.: 1 h; 400° C. to room temperature: 4 h).

Fine, heat-deformation-resistant relief structures are thereby formed. The loss in layer thickness (dark field loss) is very small (i.e., the total loss in layer thickness amounts to only 35%).

What is claimed is:

1. A negative resist comprising an admixture of a bisazide photoactive component and a polybenzoxazole precursor, wherein said polybenzoxazole precursor is a hydroxypolyamide having two terminal amino groups, each terminal amino group being end capped, the hydroxypolyamide also having the following structure:

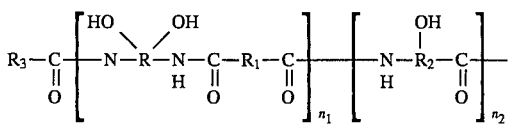

-continued

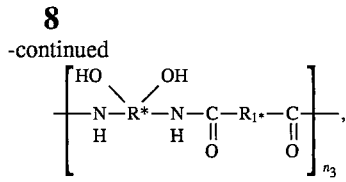

where R, R*, $R_1$, $R_1{}^*$ and $R_2$ are aromatic groups and $R_3$ is an aromatic group or a norbornene residue, where R≠R* if $R_1=R_1{}^*$ and if $n_1>0$ and $n_3>0$, where $R_1 \neq R_1{}^*$ if R=R* and if $n_1>0$ and $n_3>0$, where $n_1+n_2+n_3 \geq 3$, where $n_1$, $n_2$ and $n_3$ are selected from the group consisting of:

$n_1$=1 to 100, $n_2$ and $n_3$=0;

$n_1$ and $n_2$=1 to 100, $n_3$=0;

$n_2$=1 to 100, $n_1$ and $n_3$=0;

$n_1$, $n_2$ and $n_3$=1 to 100; and $n_1$ and $n_3$=1 to 100, $n_2$=0, and wherein the mass ratio of hydroxypolyamide to bisazide is between about 1:20 and 20:1.

2. The negative resist of claim 1, wherein the photoactive component is an aromatic bisazide.

3. The negative resist of claim 2, wherein the photoactive component is selected from the group consisting of 2,6-bis(4'-azidobenzal)-cyclohexanone and 2,6-bis(4'-azidobenzal)-4-methylcyclohexanone.

4. The negative resist of claim 1, wherein the mass ratio of hydroxypolyamide to bisazide is between about 1:10 to 10:1.

5. The negative resist of claim 2, wherein the mass ratio of hydroxypolyamide to bisazide is between about 1:10 to 10:1.

6. The negative resist of claim 3, wherein the mass ratio of hydroxypolyamide to bisazide is between about 1:10 to 10:1.

* * * * *